United States Patent
Harle

(10) Patent No.: US 6,527,853 B1
(45) Date of Patent: Mar. 4, 2003

(54) METHOD FOR PRODUCING NITRIDE MONOCRYSTALS

(75) Inventor: Volker Harle, Waldetzenberg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 09/869,221
(22) PCT Filed: Feb. 1, 2000
(86) PCT No.: PCT/DE00/00267
§ 371 (c)(1), (2), (4) Date: Oct. 1, 2001
(87) PCT Pub. No.: WO00/46431
PCT Pub. Date: Aug. 10, 2000

(30) Foreign Application Priority Data

Feb. 3, 1999 (DE) .......................... 199 04 378

(51) Int. Cl.⁷ .......................... C30B 19/00; C30B 19/08
(52) U.S. Cl. .......................... 117/54; 117/73; 117/952
(58) Field of Search .............. 117/54, 73, 952

(56) References Cited

U.S. PATENT DOCUMENTS

| 4,833,103 A | * | 5/1989 | Agostinelli et al. ............ 117/9 |
| 5,087,593 A | | 2/1992 | Narula .................. 501/96.1 |
| 5,776,603 A | | 7/1998 | Zagdoun et al. ............ 428/336 |

FOREIGN PATENT DOCUMENTS

| EP | 62001874 | 1/1987 |
| EP | 0295467 | 12/1988 |
| EP | 02145773 | 6/1990 |
| EP | 0429272 | 5/1991 |
| WO | WO 86/06361 | 11/1986 |

OTHER PUBLICATIONS

Nutt; Rodger W., "Synthesis and Characterization of (Trimethylsilyl)amino)–and (Methyl(trimethylsilyl)amino) gallium Dichloride", American Chemical Siciety 1985, pp 159–164.

Riedel, R., "Bis (dichlor–N–trimethylsilyl)cycloaminoalan Kristallstruktur und thermscher abbau zu Aluminiumnitrd", Z. anor. Allg. Chem. 603 (1991)p. 119–127, Stuttgart.

* cited by examiner

Primary Examiner—Benjamin L. Utech
Assistant Examiner—Matthew Song
(74) Attorney, Agent, or Firm—Fish & Richardson P.C.

(57) ABSTRACT

The inventive method exploits the fact that in solutions or melts which contain certain organic substances, small nitride crystallites consisting of GaN or AlN are formed by thermal reaction and decomposition. A vessel containing the melt is kept at a first temperature $T_1$. In the vessel is a substrate nucleus of he nitride to be formed, which is heated to second temperature $T_2$ through the input of energy, where $T_2 > T_1$. Epitaxial growth from the melt then takes place on the surface of the substrate nucleus. The energy input can be carried out in different ways.

14 Claims, 2 Drawing Sheets

METHOD FOR PRODUCING NITRIDE MONOCRYSTALS

Figure 1:
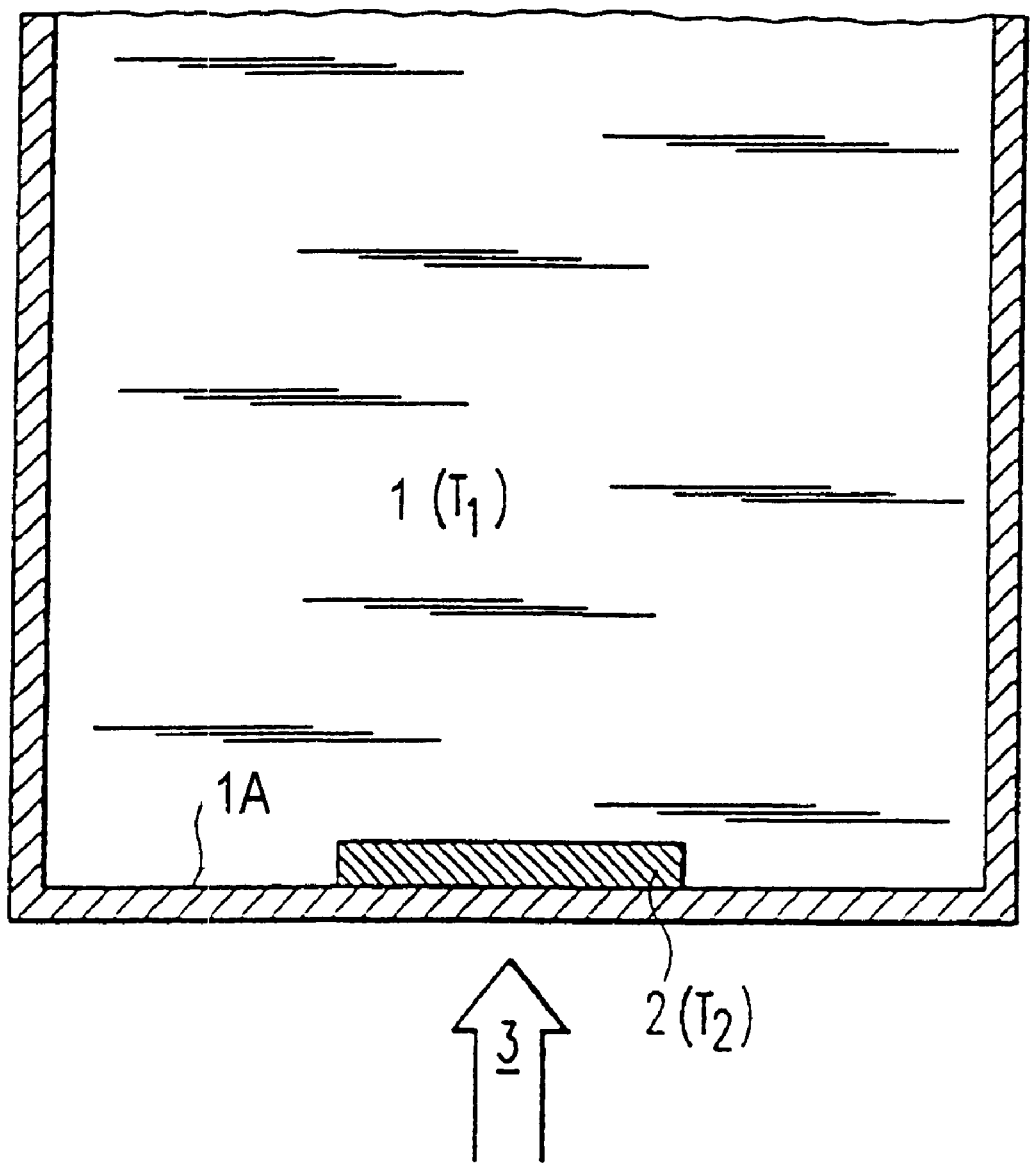

This invention relates to a method for producing nitride monocrystals pursuant to Patent claim 1.

The production of high-efficiency structural elements such as semiconductor lasers and light-emitting diodes requires substrate crystals with maximized crystal perfection. Especially structural elements based on nitride semiconductors, for example such as Ga(In,Al)N, with which the ultraviolet to blue-green spectral region of the visible spectrum has very recently been opened up, can meet this requirement only conditionally, since the necessary semiconductor layer sequences are deposited on so-called foreign substrates (sapphire; SiC; Si; GaAs; etc.). However, perfect crystals require the use of "homosubstrates," or substrates of the same or closely related material, to realize the low dislocation densities required for the structural elements.

Nitride crystals have very high bond energies. To produce corresponding substrate crystals, therefore, extremely high pressures and temperatures of about 1000° C. and higher are necessary. The existing methods are based either on methods that enable the formation of crystals from the melt at high pressure, or on a sublimation method in which crystal growth occurs essentially from the gas phase. Quasi-crystals also lead to reduction of dislocation densities, but because of the lattice misfits physically present, they contain prestresses that can be eliminated only by the interfering dislocations. Such quasi-crystals are produced by deposition of thick nitride films on foreign substrates (like sapphire; SiC; Si; GaAs; etc.). Examples of methods used are organometallic gas phase epitaxy and hydride gas phase epitaxy.

The methods described here, on the one hand, are very costly and tedious, and on the other hand they do not provide the desired crystal perfection.

The underlying objective of this invention is thus to described a method for producing nitrides, especially (Ga, Al)Ni [sic], that on the one hand is as economical as possible, and on the other hand permits the most perfect possible monocrystalline structure.

The method pursuant to the invention for solving this problem is based on the thermal reaction and decomposition (pyrolysis) of an organic substance that contains the atomic constituents of the nitride monocrystal to be formed. This organic substance is contained in a solution or in a melt that is held at a first temperature. In the solution of the melt there is a substrate nucleus consisting of the nitride material to be grown or of a related type of nitride material. This substrate nucleus is supplied with thermal energy so that a second temperature is reached, at least on its surface in contact with the melt, that is higher than the first temperature. Because of this, nitride molecules are formed and deposited on the heated surface, and the nitride monocrystal thus grows.

In papers by R. Riedel et al. (Z. anorg. allg. Chem. 603 (1991), 119–127) and W. Rodger Nutt et al. (Inorg. Chem. 1985, 24, 159–164), it was shown, for example, that AlN and GaN "microcrystals" can be produced from the thermal reaction of various organic substances (bis(dichloro-N-trimethylsilyl)cycloaminoalane; (trimethylsilyl)amino- and methyl(trimethylsilyl)aminogallium dichloride). The objective of the method described here is selective thermal decomposition on a crystal surface. For this purpose, the desired material or a related type of material is made available as a "crystal nucleus." The selective heating of just this surface leads to the decomposition of the organic compounds that are either in a melt or in a solution. Nitride molecules are formed that contain all of the atoms necessary for crystal construction. Heating the surface of the nucleus leads to the molecules formed also being able to be deposited only there, which leads to crystal growth. Such a method, moreover, is economical and requires only small expenditures for apparatus.

It is preferred for the solution or melt containing the organic substance to be in a container, and for the crystal nucleus to be positioned along a section of the container wall, with the thermal energy being fed to the substrate nucleus through this section of the container wall.

The thermal energy can be introduced in different ways. For example the substrate nucleus can be impacted by radiation emitted by a radiation source, particularly an infrared radiation source. However, the thermal energy can also be supplied inductively. Another possibility consists of introducing the thermal energy through a resistance heater. This can contain resistance wires that run in the section of the container wall and can be supplied with electrical current.

Figure 2A:
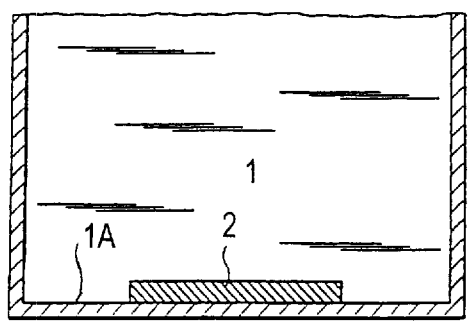
Figure 2B:
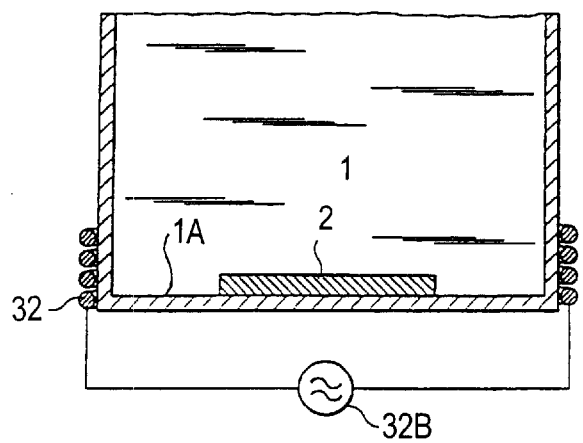
Figure 2C:
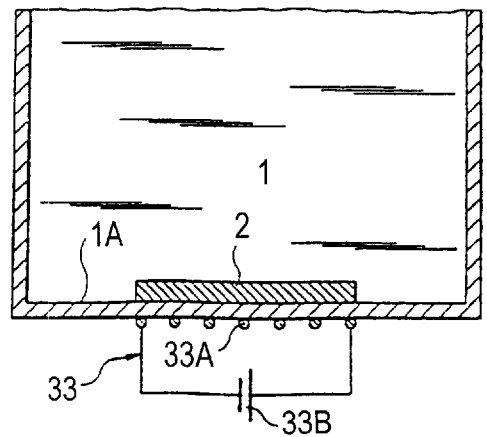

The invention will be described in detail below with reference to examples of embodiment in the drawings. The drawings show:

FIG. 1 a schematic arrangement for implementing the method of the invention;

FIGS. 2A to C forms of embodiment with respect to supplying the thermal energy to the substrate nucleus.

FIG. 1 shows a schematic arrangement for implementing the method of the invention.

This arrangement includes a container 1 to hold a liquid solution or melt that contains an organic compound that contains the atomic constituents of the nitride monocrystal to be formed. The solution or melt is held at a first temperature $T_1$, for example by storing the container 1 in a furnace and adjusting the temperature of the furnace to the temperature $T_1$. At the bottom of the container 1 is placed a substrate nucleus 2 that consists of the nitride to be grown or a related type of nitride. This substrate nucleus 2 is heated by means of an energy source that is symbolized by the arrow 3, so that at least its surface in contact with the melt reaches a temperature $T_2$ that is higher than $T_1$. This makes possible the thermal decomposition of the organic substance and the formation and deposition of nitride molecules on the substrate nucleus 2.

When gallium nitride (GaN), for example, is to be grown, as described in the publication by Nutt et al. cited above, (trimethylsilyl)aminogallium dichloride or methyl (trimethylsilyl)aminogallium dichloride can be used as the organic substance.

On the other hand, if aluminum nitride (AlN) is to be grown, as described in the publication by Riedel et al. cited above, bis(dichloro-N-trimethylsilyl)cycloaminoalane can be used as the organic substance.

FIGS. 2A to 2C illustrate three different types of embodiment for the energy supply. The arrow 3 in FIG. 1 is thus replaced in these figures by corresponding conceivable structures.

According to FIG. 2A, for purposes of radiant heating there is a light source 31, preferably an infrared light source, below the container 1, whose emitted radiation is pointed at the section of the container wall at which the substrate nucleus 2 is located. It is also theoretically conceivable for the substrate nucleus 2 to be at any position in the melt whatsoever, and for the radiation of an external light source to be focused on it by suitable optics.

In the arrangement of FIG. 2B, the heat energy is introduced by inductive coupling. To this end, the lower section of the container 1 is surrounded by a coil winding 32 that is powered with alternating current from a source of alternating voltage 32B. Here also there is spatial freedom inasmuch as the coil 32 and thus the substrate nucleus 2 can be positioned at any longitudinal position on the container 1.

In the arrangement of FIG. 2C, the thermal energy is supplied by a resistance heater 33. The resistance heater 33 has a resistance wire 33A that is in contact with the container wall and can be powered by a direct-voltage source 33B with direct current. This produces Joule heat that can penetrate through the container wall into the substrate nucleus 2. The resistance wire 33A preferably follows a looped or spiral-shaped path and thus covers a certain area, in order to impact it as homogeneously as possible with thermal energy. It can be embedded permanently in the container wall with connecting wires fed to the outside. However, it is also conceivable for it to be inserted into recesses provided for it on the outside of the container wall when needed.

Heat can be supplied very selectively to the substrate nucleus 2 by this method, but the substrate nucleus 2 has to be positioned on the container wall.

A fourth possibility for energy supply, not illustrated, consists of introducing microwave energy. For this purpose, a microwave energy source, for example a magnetron, can be placed beneath the container 1. The microwave radiation emitted by it can be fed to the section of the container wall on which the substrate nucleus 2 is positioned, with or without the use of a microwave guide.

Supplying the energy by means of electromagnetic radiation or inductively has the advantage over the resistance heater that the substrate nucleus 2 in principle can be located anywhere in the melt. In the case of the resistance heater, on the other hand, the substrate nucleus 2 has to be in contact with a wall of the container.

In addition to the temperature control of the growth process described and pursuant to the invention, other measures can be resorted to for homogenizing the growth process. For example, the melt can be agitated constantly during growth by a mechanical mixer. The substrate nucleus 2 can also be rotated around its cylindrical axis during growth, and/or it can be pulled through the solution at a low velocity. To control crystal growth, a static or likewise rotating electric field or magnetic field can also be applied. Finally, laminar flow can be produced in the solution, for example by having the solution flow to the substrate nucleus in a tube pointed at the substrate nucleus. All of the measures mentioned can arbitrarily be combined with one another to provide optimal growth conditions.

What is claimed is:

1. Method for producing a substrate of a nitride monocrystal suitable for semiconductor manufacture, characterized by the process steps
   preparation of a solution or melt containing an organic compound at a first temperature $T_1$, wherein
      the organic compound contains the atomic constituents of the nitride monocrystal to be formed, and wherein there is a substrate nucleus of the nitride to be grown or of a related nitride in the melt, supplying thermal energy to the substrate nucleus so that a temperature $T_2$ is reached at least by its surface in contact with the melt, wherein $T_2 > T_1$.

2. Method pursuant to claim 1, characterized by the fact that
   the melt is in a container, and
   the substrate nucleus is positioned along at least one section of the container wall, and
   the thermal energy is supplied to the substrate nucleus through this section of the container wall.

3. Method pursuant to claim 2, characterized by the fact that
   the thermal energy is supplied by the radiation of a radiation source, particularly of an infrared radiation source.

4. Method pursuant to claim 2, characterized by the fact that
   the thermal energy is supplied by inductive coupling.

5. Method pursuant to claim 2, characterized by the fact that
   the thermal energy is supplied by a resistance heater, that contains resistance wires powered with an electrical current, which are in contact with the container wall.

6. Method pursuant to claim 2, characterized by the fact that
   the resistance wires are embedded in the container wall.

7. Method pursuant to claim 2, characterized by the fact that
   the thermal energy is supplied by microwave radiation.

8. Method pursuant to claim 1, characterized by the fact that
   the thermal energy is supplied by the radiation of a radiation source, particularly of an infrared radiation source.

9. Method pursuant to claim 1, characterized by the fact that
   the thermal energy is supplied by inductive coupling.

10. Method pursuant to claim 1, characterized by the fact that
    the thermal energy is supplied by a resistance heater, that contains resistance wires powered with an electrical current, which are in contact with the container wall.

11. Method pursuant to claim 10, characterized by the fact that
    the resistance wires are embedded in the container wall.

12. Method pursuant to claim 1, characterized by the fact that
    the thermal energy is supplied by microwave radiation.

13. Method pursuant to claim 1, characterized by the fact that
    the nitride is AlN, and
    the organic compound is bis(dichloro-N-trimethylsilyl) cycloaminoalane.

14. Method pursuant to claim 1, characterized by the fact that
    the nitride is GaN, and
    the organic compound is (trimethylsilyl)aminogallium dichloride or methyl(trimethylsilyl)aminogallium dichloride.

* * * * *